US010139450B2

(12) United States Patent
Bell

(10) Patent No.: US 10,139,450 B2
(45) Date of Patent: Nov. 27, 2018

(54) PLUG-IN FUEL PUMP POWER BYPASS / TEST SYSTEM

(71) Applicant: Jason A. Bell, Bridgeport, WV (US)

(72) Inventor: Jason A. Bell, Bridgeport, WV (US)

(*) Notice: Subject to any disclaimer, the term of this patent is extended or adjusted under 35 U.S.C. 154(b) by 94 days.

(21) Appl. No.: 15/483,822

(22) Filed: Apr. 10, 2017

(65) Prior Publication Data

US 2018/0292459 A1 Oct. 11, 2018

(51) Int. Cl.

*G01M 15/02* (2006.01)
*G01R 31/327* (2006.01)
*G01R 31/00* (2006.01)
*F02M 65/00* (2006.01)

(52) U.S. Cl.

CPC ......... *G01R 31/3278* (2013.01); *F02M 65/00* (2013.01); *G01R 31/006* (2013.01)

(58) Field of Classification Search

USPC ............................ 73/114.38, 114.41, 114.77
See application file for complete search history.

(56) References Cited

U.S. PATENT DOCUMENTS 4,333,338 A * 6/1982 Patey .................... G01M 13/00 73/114.41
6,321,593 B1 * 11/2001 Rich ...................... F02M 65/00 33/607
2008/0148832 A1 * 6/2008 Baker .................... F02M 65/00 73/116.01
2013/0046436 A1 * 2/2013 McGaughey ........... F04B 17/03 701/33.5
2013/0174655 A1 * 7/2013 Schoenfeld ............ F02M 65/00 73/114.41
2013/0186605 A1 * 7/2013 Schoenfeld ............ F02M 53/00 165/157
2018/0045122 A1 * 2/2018 Veilleux ................ F01D 21/003

* cited by examiner

*Primary Examiner* — Eric S McCall
(74) *Attorney, Agent, or Firm* — Muncy, Geissler, Olds & Lowe, P.C.; Aaron J. Sanders

(57) ABSTRACT

Disclosed is an apparatus for bypassing and testing a fuel pump relay for a fuel pump of a vehicle. In an aspect, the apparatus includes a first pair of terminal pins configured to be inserted into the run/start signal fuse slot in the fuse box of the vehicle, a second pair of terminal pins configured to be inserted into a fuel pump fuse slot in the fuse box of the vehicle, a power input device configured to be conductively coupled to a power source of the vehicle, and a circuit configured to conductively couple, based on reception of electrical current from a run/start signal out terminal pin of the first pair of terminal pins, the power input device to a fuel pump terminal pin of the second pair of terminal pins to provide electrical current from the power input device to the fuel pump of the vehicle.

20 Claims, 11 Drawing Sheets

280

10 20 30 40 50 60 70 80 90

210
220
230
240
250
260
270

NC = NORMALLY CLOSED (VEHICLE OFF)
NO = NORMALLY OPEN (VEHICLE ON / COIL ENERGIZED)

PLUG-IN FUEL PUMP POWER BYPASS / TEST SYSTEM

BACKGROUND

1. Field of the Disclosure

Aspects of the disclosure relate to a plug-in fuel pump power bypass/test system.

2. Description of the Related Art

Various 2007 to 2014 model year Chrysler®, Jeep®, Dodge®, and Volkswagen® vehicles contain a particular style of fuse box called a Totally Integrated Power Module (TIPM). These fuse boxes have an inherent problem with the circuit board mounted fuel pump relay, insofar as the fuel pump relay often fails after approximately three to six years of operation.

In normal operation, the fuel pump relay serves as a conduit, transferring power to the electric fuel pump coupled to the fuel tank of the vehicle. When the vehicle is first turned on (via the ignition switch), power is applied to the electromagnetic coil in the fuel pump relay, causing the fuel pump relay to switch to the normally open position and allow current to pass through to the fuel pump, which activates and pumps the fuel (e.g., gasoline, diesel, etc.) necessary to start the engine. When the vehicle is turned off, power is removed from the electromagnetic coil in the fuel pump relay, causing the fuel pump relay to switch to the normally closed position via a spring return mechanism, thereby cutting off current to the fuel pump.

The fuel pump relay in a TIPM is a single relay that can intermittently fail to switch to the normally open position when power is applied to the electromagnetic coil, preventing the vehicle from starting, since no power is provided to the electric fuel pump. In this situation, the vehicle acts as if it is out of fuel without triggering any sensors or illuminating any dashboard warning lights. Fuel pump relays can also fail when the normally open contacts essentially "weld" themselves together due to high resistance and excessive heat, which can cause the fuel pump to remain powered on after the vehicle is turned off (thereby draining the battery). In a small percentage of vehicles, the electromagnetic coil in the fuel pump relay can fail, preventing the contacts from switching to the normally open position and resulting in no power delivered to the fuel pump. Additionally, some vehicles may experience low idle or stalling issues as the fuel pump relay turns on and off at varying rates while driving, creating safety issues.

There are existing solutions to address a defective fuel pump relay, but each has drawbacks. For example, in 2014, a recall was implemented for certain 2011 to 2013 model year vehicles, such as the Dodge® Durango™ and Jeep® Grand Cherokee™, to address failing fuel pump relays on the TIPM fuse box. This recall requires dealer installation of an external fuel pump relay where two wires are cut and one wire is spliced within several wire harnesses under the fuse box. Although many affected vehicle owners find this solution to be functional, many in the automotive industry advise against cutting wires under the fuse box. In addition, numerous other vehicles with the same faulty fuel pump relay were not part of the recall, and the cost associated with such an external relay installation for non-affected vehicle owners is high. For example, such an installation may cost the vehicle owner from $400 to $600.

Another solution is to repair the fuse box. Here, the fuse box is sent to a repair shop and broken down to the circuit board level. This is an effective solution insofar as the faulty fuel pump relay is replaced. However, the vehicle is inoperable while the repair is being performed, which can take days to weeks. Such a repair is also costly, for example, $300 or more. In addition, because the vehicle owner often removes and reinstalls the fuse box in order to be able to send it away to the repair shop, some vehicle owners may damage the fuse box during removal from the vehicle and/or fail to reinstall it properly after the repair.

Yet another solution is to replace the fuse box entirely. Replacing the fuse box with a new or used fuse box can be the most expensive solution because it requires removal, installation, and potentially reprogramming of the fuse box. It may take up to an hour or more to remove the old fuse box from a vehicle and reinstall the new or used fuse box. In some cases, used fuse boxes must be reprogrammed by a dealer, which can add another $100 to the cost. The vehicle owner also risks purchasing a used fuse box that has not been properly refurbished or contains relays that fail in a short period of time. Purchasing and replacing the fuse box can cost approximately $350 to $1,200.

Yet another solution is a bypass jumper cable available from Vertical Visions LLC that can bypass a faulty fuel pump relay by using power from another fuse slot in the fuse box. Specifically, when the cable is plugged into two fuse slots in the fuse box, it can check the fuel pump when the vehicle is turned off, test the +12 voltage direct current (VDC) output from the existing fuel pump relay, and, if the fuel pump relay is faulty, can bypass the fuel pump relay by using power from another fuse slot. However, this solution has several limitations, such as no remote start capability, unknown safety issues during a crash, etc., which precludes it from being a viable permanent solution.

SUMMARY

The following presents a simplified summary relating to one or more aspects disclosed herein. As such, the following summary should not be considered an extensive overview relating to all contemplated aspects, nor should the following summary be regarded to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, an apparatus configured to bypass and test a fuel pump relay for a fuel pump of a vehicle includes a first pair of terminal pins configured to be inserted into a run/start signal fuse slot in a fuse box of the vehicle, a second pair of terminal pins configured to be inserted into a fuel pump fuse slot in the fuse box of the vehicle, the second pair of terminal pins comprising at least a fuel pump terminal pin, a power input device configured to be conductively coupled to a power source of the vehicle, and a circuit configured to conductively couple, based on reception of electrical current from a run/start signal out terminal pin of the first pair of terminal pins, the power input device to the fuel pump terminal pin to provide electrical current from the power input device to the fuel pump of the vehicle.

In an aspect, an apparatus configured to bypass and test a fuel pump relay for a fuel pump of a vehicle includes a first pair of terminal pins configured to be inserted into a run/start signal fuse slot in a fuse box of the vehicle, a second pair of terminal pins configured to be inserted into a fuel pump fuse slot in the fuse box of the vehicle, the second pair of terminal pins comprising a fuel pump relay terminal pin and a fuel pump terminal pin, a power input device configured to be conductively coupled to a power source of the vehicle, and a circuit configured to enable a fuel pump relay bypass mode of the apparatus, wherein the circuit being configured to enable the fuel pump relay bypass mode comprises the circuit being configured to conductively couple, based on reception of electrical current from a run/start signal out terminal pin of the first pair of terminal pins, the power input device to the fuel pump terminal pin to provide electrical current from the power input device to the fuel pump of the vehicle.

In an aspect, an apparatus configured to bypass and test a fuel pump relay for a fuel pump of a vehicle includes a first pair of terminal pins configured to be inserted into a run/start signal fuse slot in a fuse box of the vehicle, a second pair of terminal pins configured to be inserted into a fuel pump fuse slot in the fuse box of the vehicle, the second pair of terminal pins comprising a fuel pump relay terminal pin and a fuel pump terminal pin, a third pair of terminal pins configured to be inserted into a VDC fuse slot in the fuse box of the vehicle, a ground wire configured to conductively couple to a chassis ground of the vehicle or an engine fuel pump control of the vehicle, a switch configured to toggle between a plurality of modes of the apparatus, the plurality of modes comprising a fuel pump relay bypass mode, an original fuel pump relay operation mode, a fuel pump test mode, and a disable fuel pump mode, and a switching device coupled to the switch. Based on the switch being toggled to the fuel pump relay bypass mode, the switch is configured to conductively couple a run/start signal out terminal pin of the first pair of terminal pins to the switching device and the switching device is configured to provide electrical current from a power input terminal pin of the third pair of terminal pins to the fuel pump terminal pin to provide electrical current from the power input terminal pin of the third pair of terminal pins to the fuel pump of the vehicle. Based on the switch being toggled to the original fuel pump relay operation mode, the switch is configured to conductively couple the fuel pump relay terminal pin of the second pair of terminal pins to the switching device and the switching device is configured to provide electrical current from the power input terminal pin of the third pair of terminal pins to the fuel pump terminal pin to provide electrical current from the power input terminal pin of the third pair of terminal pins to the fuel pump of the vehicle. Based on the switch being toggled to the fuel pump test mode, the switch is configured to conductively couple the power input terminal pin of the third pair of terminal pins to the switching device and the switching device is configured to provide electrical current from the power input terminal pin of the third pair of terminal pins to the fuel pump terminal pin to provide electrical current from the power input terminal pin of the third pair of terminal pins to the fuel pump of the vehicle. Based on the switch being toggled to the disable fuel pump mode, the switch is configured to prevent a conductive connection to the fuel pump terminal pin.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof.

DETAILED DESCRIPTION

Figure 1:
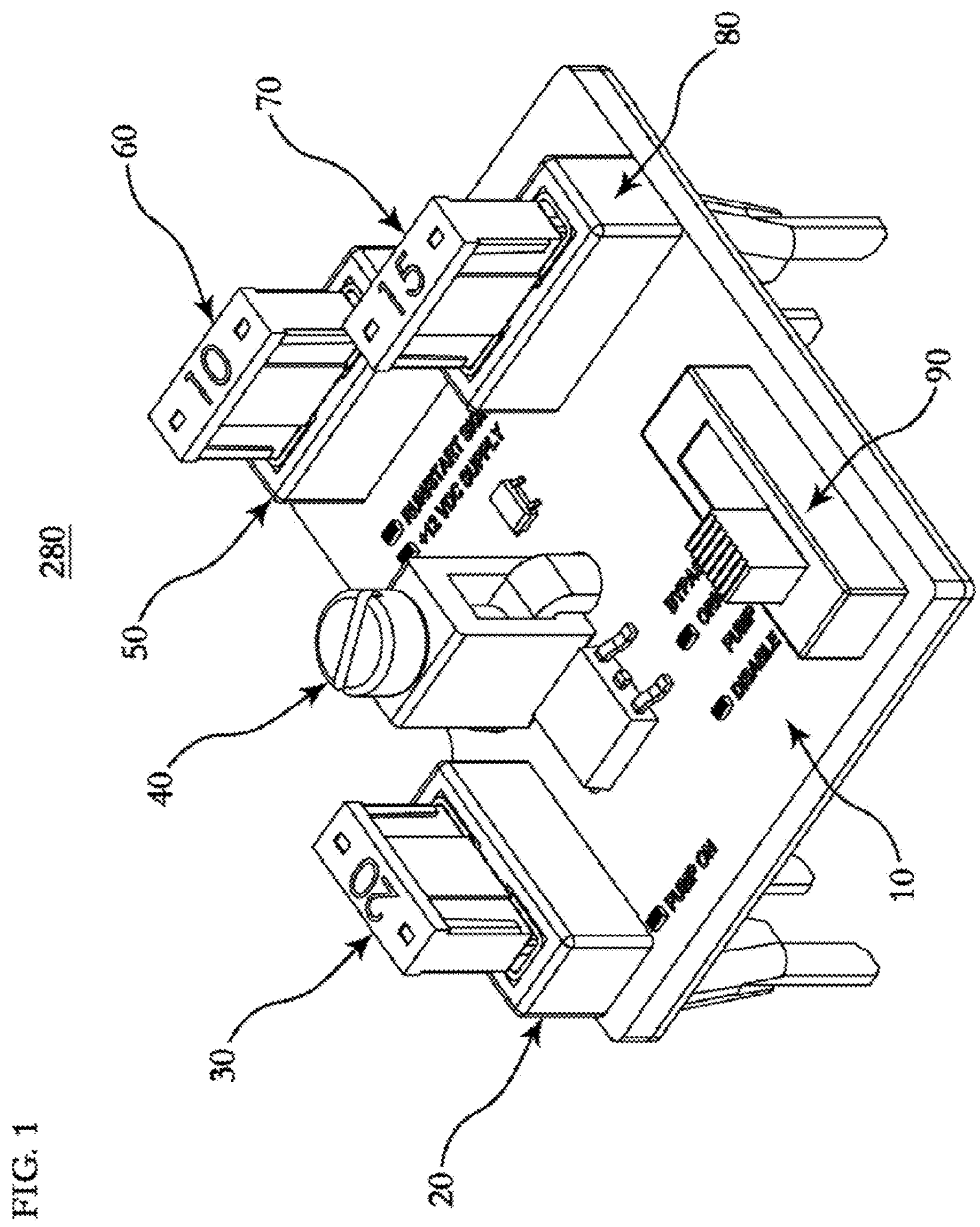
FIG. 1 is a perspective isometric view of an exemplary fuel pump power bypass/test system according to at least one aspect of the disclosure.

Disclosed is an apparatus configured to bypass and test a fuel pump relay for a fuel pump of a vehicle. In an aspect, the apparatus includes a first pair of terminal pins configured to be inserted into a run/start signal fuse slot in a fuse box of the vehicle, a second pair of terminal pins configured to be inserted into a fuel pump fuse slot in the fuse box of the vehicle, the second pair of terminal pins comprising at least a fuel pump terminal pin, a power input device configured to be conductively coupled to a power source of the vehicle, and a circuit configured to conductively couple, based on reception of electrical current from a run/start signal out terminal pin of the first pair of terminal pins, the power input device to the fuel pump terminal pin to provide electrical current from the power input device to the fuel pump of the vehicle.

These and other aspects of the disclosure are disclosed in the following description and related drawings directed to specific aspects of the disclosure. Alternate aspects may be devised without departing from the scope of the disclosure. Additionally, well-known elements of the disclosure will not be described in detail or will be omitted so as not to obscure the relevant details of the disclosure.

The words “exemplary” and/or “example” are used herein to mean “serving as an example, instance, or illustration.” Any aspect described herein as “exemplary” and/or “example” is not necessarily to be construed as preferred or advantageous over other aspects. Likewise, the term “aspects of the disclosure” does not require that all aspects of the disclosure include the discussed feature, advantage or mode of operation.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements. In addition, terminology of the form "at least one of A, B, or C" or "one or more of A, B, or C" or "at least one of the group consisting of A, B, and C" used in the description or the claims means "A or B or C or any combination of these elements." For example, this terminology may include A, or B, or C, or A and B, or A and C, or A and B and C, or 2A, or 2B, or 2C, and so on.

As discussed above, there are several existing solutions to address a defective fuel pump relay. However, as discussed above, these solutions are expensive, time consuming to install, temporary, and/or difficult to implement. The present disclosure addresses at least these drawbacks by providing a circuit board based fuel pump power bypass/test system that plugs into a vehicle's fuse box to bypass a faulty fuel pump relay.

As noted above, a recall was implemented for certain 2011 to 2013 model year vehicles to address failing fuel pump relays on the TIPM fuse box in the affected vehicles. This recall requires dealer installation of an external fuel pump relay where two wires are cut and one wire is spliced within several wire harnesses under the fuse box. The fuel pump power bypass/test system of the present disclosure utilizes similar electrical connections as this external fuel pump relay solution, but does not involve cutting or splicing into the existing wire harness. Rather, in an aspect, the disclosed fuel pump power bypass/test system uses three fuse receptacles in the fuse box and a single wire that connects to the vehicle chassis ground.

The result is a significantly less expensive and much easier to install device that can test the vehicle's existing fuel pump relay and fuel pump, and bypass a fuel pump relay problem without involving the cutting or splicing of any connections in the vehicle wire harness. In an aspect, the disclosed fuel pump power bypass/test system also contains a mechanism for disabling the fuel pump (e.g., for security purposes), as well as a light emitting diode (LED) to indicate whether the vehicle's battery levels are sufficient. Additionally, installation time is reduced from one to two hours for the external fuel pump relay recall solution to five to ten minutes for the disclosed circuit board based system.

In an aspect, the disclosed fuel pump power bypass/test system includes a circuit board having six terminals (male pins) on the bottom that plug into three fuse slots in a vehicle's existing TIPM fuse box. Before the user installs the system, the user should perform the following actions: 1) remove three existing fuses (e.g., M25, M30, and M37 on a TIPM) from the vehicle's fuse box and insert them into corresponding fuse slots on the circuit board of the fuel pump power bypass/test system of the present disclosure, 2) depending on the make and model of the vehicle, remove one or two cartridge fuses (e.g., J3 and/or J15 on a TIPM) from the vehicle's fuse box and replace them with low profile versions of the same to make room for the disclosed fuel pump power bypass/test system, and 3) connect a single wire from the ground terminal of the fuel pump power bypass/test system's circuit board to the vehicle chassis ground or engine fuel pump control connection.

The vehicle's fuel pump control connection is the only connection that is not made by plugging the disclosed fuel pump power bypass/test system into the fuse slots of the vehicle's fuse box. If the user connects the wire from the ground terminal of the fuel pump power bypass/test system's circuit board to the vehicle's fuel pump control connection by splicing the wire to a harness wire, any failure of the disclosed fuel pump power bypass/test system's control circuitry will trigger a vehicle trouble code. If the user instead connects the wire from the ground terminal to the vehicle chassis ground, any failure of the disclosed fuel pump power bypass/test system's control circuitry will not trigger a vehicle trouble code itself, but it will permit the failure of the existing fuel pump relay coil to trigger a vehicle trouble code.

Once plugged in and the ground connection completed, the disclosed fuel pump power bypass/test system can display an LED (e.g., green) to confirm that the vehicle has a battery voltage of at least +12.0 VDC. As will be described further herein, a four position switch on the disclosed fuel pump power bypass/test system may provide the following functionality:

1) Bypass Mode: This switch position is powered by the vehicle's run/start +12 VDC signal, which is provided by the fuse terminal on the circuit board of the fuel pump power bypass/test system corresponding to the run/start +12 VDC fuse terminal on the vehicle's fuse box (e.g., the M37 fuse terminal on a TIPM), which then powers two metal-oxide semiconductor field-effect transistors (MOSFETs) on the circuit board of the fuel pump power bypass/test system. A colored LED (e.g., green) may be illuminated when the run/start +12 VDC signal is present. The larger MOSFET of the two MOSFETs then passes a separate +12 VDC supply signal from the fuse terminal on the circuit board of the fuel pump power bypass/test system corresponding to the +12 VDC fuse terminal on the vehicle's fuse box (e.g., the M30 fuse terminal on a TIPM) to provide source power (i.e., electrical current) across the fuse terminal on the circuit board of the fuel pump power bypass/test system corresponding to the fuel pump fuse terminal on the vehicle's fuse box (e.g., the M25 fuse terminal on a TIPM) to the fuel pump. The run/start +12 VDC signal indicates the need for power to be supplied to the fuel pump when attempting to start the vehicle. The bypass mode provides power to the fuel pump when an existing faulty fuel pump is present.

2) Original Relay: This switch position is powered by the original +12 VDC faulty relay output from the fuse terminal on the circuit board of the fuel pump power bypass/test system corresponding to the fuel pump fuse terminal on the vehicle's fuse box, which then powers two MOSFETs. The larger of the two MOSFETs then passes a separate +12 VDC supply signal from the fuse terminal on the circuit board of the fuel pump power bypass/test system corresponding to the +12 VDC fuse terminal on the vehicle's fuse box to provide source power across the fuse terminal on the circuit board of the fuel pump power bypass/test system corresponding to the fuel pump fuse terminal on the vehicle's fuse box to the fuel pump. This arrangement sends a +12 VDC signal to the fuel pump if the original fuel pump relay is sending +12 VDC through the fuel pump fuse terminal. A colored LED (e.g., green) can be illuminated when the +12 VDC signal supplied via the original fuel pump relay is detected, in order to provide diagnostic feedback of the vehicle's existing fuel pump relay output. If the original fuel pump relay +12 VDC signal is intermittent or is not present, the LED and the two MOSFETs of the fuel pump power bypass/test system will duplicate it via the +12 VDC supply provided to the fuel pump.

3) Fuel Pump Test: This switch position permits the user to test the fuel pump when the vehicle is on or off in order to confirm the proper operation of the fuel pump, or drain the fuel tank. This mode can also be used to drain the fuel tank by pumping fuel out of the tank when the vehicle is off. When placed in this mode, a +12 VDC signal is sent to the third switch position, which then powers two MOSFETs. The larger of the two MOSFETs then passes a separate +12 VDC supply signal from the fuse terminal on the circuit board of the fuel pump power bypass/test system corresponding to the +12 VDC fuse terminal on the vehicle's fuse box to provide source power across the fuse terminal on the circuit board of the fuel pump power bypass/test system corresponding to the fuel pump fuse terminal on the vehicle's fuse box to the fuel pump.

4) Disable Fuel Pump: This switch position completely disables power to both MOSFETs on the circuit board of the fuel pump power bypass/test system and the fuel pump, serving as, for example, an anti-theft device. A colored LED (e.g., red) can be illuminated when in this mode to indicate that the fuel pump is disabled.

As will be described further herein, the disclosed fuel pump power bypass/test system may contain five LEDs to provide the following feedback to the user:

1) Run/Start Signal LED: Illuminates (e.g., green) when the vehicle is on (i.e., engine starting or running) and a +12 VDC signal is fed across the fuse terminal on the circuit board of the fuel pump power bypass/test system corresponding to the run/start +12 VDC fuse terminal on the vehicle's fuse box (e.g., the M37 fuse terminal on a TIPM). This LED indicates to the user that the vehicle is on and bypass mode can be used.

2)+12 VDC Supply LED: Illuminates (e.g., green) when a +12.0 VDC or greater battery supply is available as the main power source used to feed both MOSFETs, the fuel pump, a comparator circuit, all LEDs, and other circuitry. This LED may be illuminated continuously, unless the battery is disconnected or below +12 VDC. The comparator circuit on the circuit board of the fuel pump power bypass/test system can determine whether the battery voltage exceeds +12.0 VDC. This LED feedback can be used to determine if sufficient battery voltage is present to start the vehicle.

3) Disable Pump LED: When the switch is in this position, this LED illuminates (e.g., red) to indicate to the user that the anti-theft fuel pump disable mode is selected. In this mode, no power can enter the fuel pump and the vehicle will not start.

4) Original Relay LED: Illuminates (e.g., green) when the +12 VDC signal supplied via the original fuel pump relay is detected. If the original fuel pump relay +12 VDC signal is intermittent or not present, this LED and the two MOSFETs on the circuit board of the fuel pump power bypass/test system will mimic it via the +12 VDC supply provided to the fuel pump. This LED feedback can be used to determine whether the vehicle's fuel pump relay is faulty.

5) Pump On LED: Illuminates (e.g., green) when power is supplied across the fuse terminal on the circuit board of the fuel pump power bypass/test system corresponding to the fuel pump fuse terminal on the vehicle's fuse box (e.g., the M25 20 amp fuse terminal on a TIPM) and out to the fuel pump.

Note that the fuel pump fuse slot in the circuit board of the fuel pump power bypass/test system should have a direct connection to the fuel pump. This arrangement permits the injection of an alternate power source into the fuel pump fuse slot and the detection of the output voltage of the fuel pump relay. Many modern vehicles contain this configuration.

Turning now to the drawings, FIG. 1 is an isometric view of an exemplary fuel pump power bypass/test system 280 according to at least one aspect of the disclosure. The fuel pump power bypass/test system 280 contains a circuit board 10 that distributes electrical energy in order to bypass and test a vehicle's internal fuel pump relay. As noted above, faulty fuel pump relays can result in situations where the vehicle will not start due to the non-delivery of power (i.e., electrical current) to the fuel pump or battery drainage due to a fuel pump relay that is stuck in the on position when the vehicle is turned off. Although rare, fuel pump relays can also fail while the vehicle is being driven, resulting in loss of vehicle power and creating a serious safety issue. In many modern vehicles, the faulty fuel pump relay is soldered to a circuit board located inside a plastic fuse box enclosure, which is difficult to access by the owner and not serviceable by the vehicle manufacturer or dealer.

In an aspect, the fuel pump power bypass/test system 280 can be plugged in to the fuse slots of a vehicle's fuse box assembly (e.g., 310 in FIG. 6) without the use of tools. By utilizing connections to the vehicle's+12 VDC power signal, run/start signal, fuel pump +12 VDC power input connection, and a chassis ground or engine fuel pump control connection, the fuel pump power bypass/test system 280 can provide an alternate power route to the fuel pump fuse connection (e.g., 350 in FIG. 9) to keep the vehicle operating normally. As discussed above, and as will be discussed further below, the fuel pump power bypass/test system 280 also contains a mechanism for disabling the fuel pump for security purposes as well as an LED to determine if the vehicle's battery levels are sufficient.

With continued reference to FIG. 1, the circuit board 10 may contain vias (holes) to permit the mounting of through-hole and surface mounted devices as further described below. A single ground wire connection (e.g., 410 of FIG. 8) from a ground lug 40 to the vehicle chassis (e.g., 400 of FIG. 9) completes the electrical circuit and permits proper functionality of the fuel pump power bypass/test system 280. Fuse holder 20, fuse holder 50, and fuse holder 80 hold, secure, and allow the passage of electrical energy (i.e., current) across fuse 30, fuse 60, and fuse 70, respectively. Prior to insertion of the fuel pump power bypass/test system 280, the vehicle's existing fuses (e.g., fuse 30, fuse 60, and fuse 70) can be removed from the corresponding fuse slots (e.g., 330, 290, and 300, respectively, of FIG. 6) and then inserted into fuse holder 20, fuse holder 50, and fuse holder 80, respectively, to ensure that the fuse box's original fuse type and amp ratings are not altered.

The reuse of the existing fuses also helps to maintain the functionality and capacity of electrical circuits within the vehicle. However, fuse 30, fuse 60, and fuse 70 can be supplied as new parts within the fuel pump power bypass/test system 280, provided they contain the same fuse type and rating as the corresponding fuse slot (e.g., 330, 290, and 300, respectively, of FIG. 6). Fuse 30, fuse 60, and fuse 70 can be manually inserted at 0 or 180 degree intervals into fuse holder 20, fuse holder 50, and fuse holder 80, respectively, which may be soldered to circuit board 10. Fuse holder 20, fuse holder 50, and fuse holder 80 are located on circuit board 10 to correspond to and align with the corresponding fuse slots in the existing fuse box (e.g., 330, 290, and 300, respectively, of FIG. 6) to assist the user with insertion of the fuel pump power bypass/test system 280 into the fuse box assembly (e.g., 310 in FIG. 6). Fuse holder 20, fuse holder 50, and fuse holder 80 can thereby be viewed as an extension of the vehicle's existing and corresponding fuse slots.

As will be appreciated, in an aspect, the fuel pump power bypass/test system 280 may not include fuse holder 20, fuse holder 50, and fuse holder 80. Instead, fuse 30, fuse 60, and fuse 70 may be integral to the fuel pump power bypass/test system 280. In this aspect, terminal pins 220 to 270 (e.g., FIG. 3) may be extensions of the integrated fuses, rather than separate terminal pins coupled to fuse holder 20, fuse holder 50, and fuse holder 80.

Figure 8:
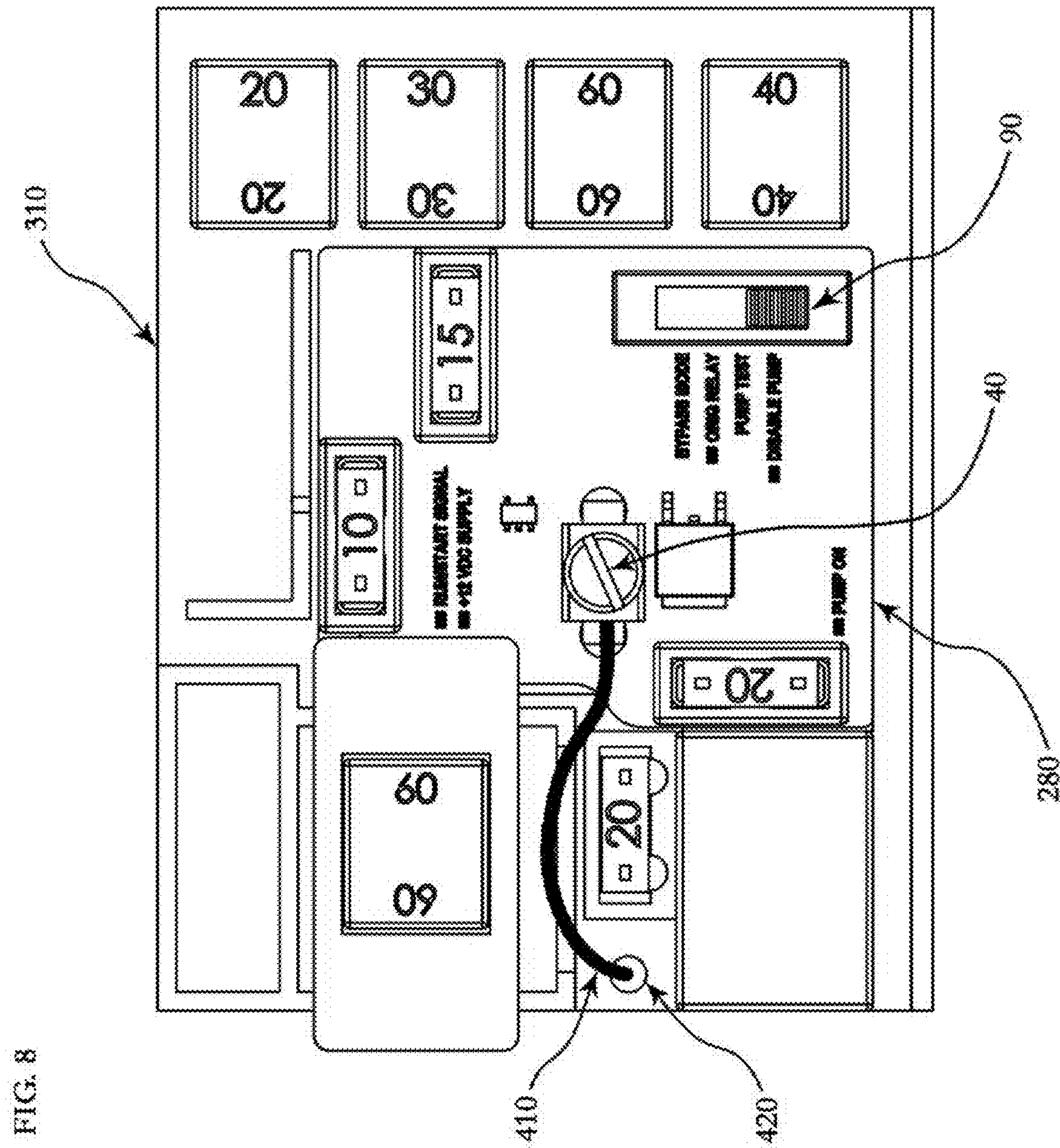
FIG. 8 is a top view of an exemplary fuel pump power bypass/test system after it is installed in an exemplary fuse box according to at least one aspect of the disclosure.
Figure 9:
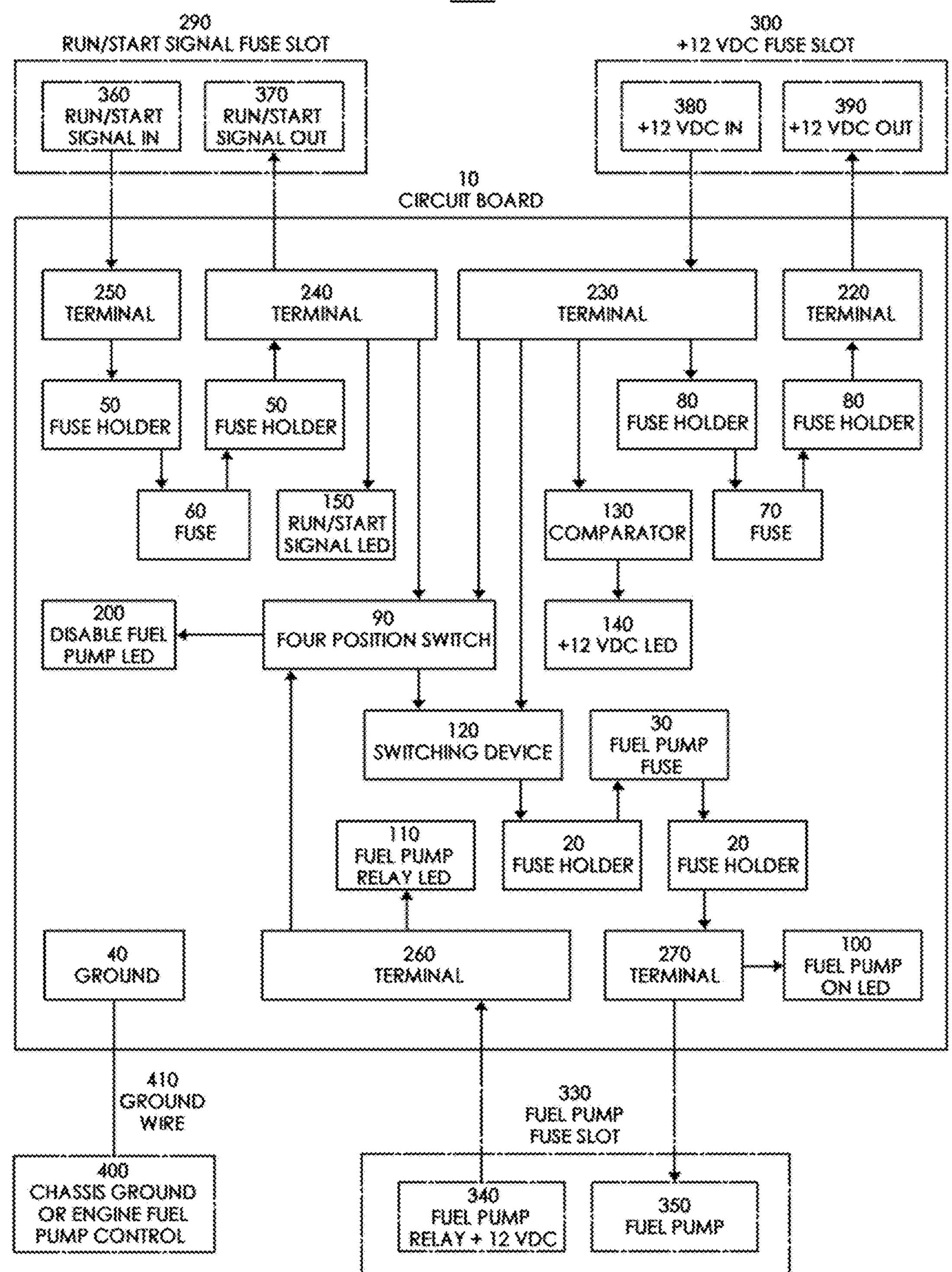
FIG. 9 is a block diagram of an exemplary fuel pump power bypass/test system according to at least one aspect of the disclosure.

The ground wire (e.g., 410 of FIG. 8) of the fuel pump power bypass/test system 280 can be connected between ground lug 40 and the vehicle chassis ground or engine fuel pump control (e.g., 400 of FIG. 9). Ground lug 40 may be a screw that can be tightened down on the conductive stranded or solid wire(s) of the ground wire (e.g., 410 of FIG. 8). This connection completes an electrical circuit where the fuel pump power bypass/test system 280 is connected to the vehicle's battery ground. The ground wire (e.g., 410 of FIG. 8) can also connect to circuit board 10 via a soldered connection, a terminal strip, insulation displacement connector, or by plugging in to a fuse box assembly (e.g., 310 of FIG. 6) that contains a connection to the vehicle chassis ground or the engine fuel pump control (e.g., 400 of FIG. 9).

With continued reference to FIG. 1, the fuel pump power bypass/test system 280 further includes a switch 90. Switch 90 is a double-pole switch (or other such circuit) that controls four modes of operation via four switch positions, as discussed above and further below.

Figure 2:
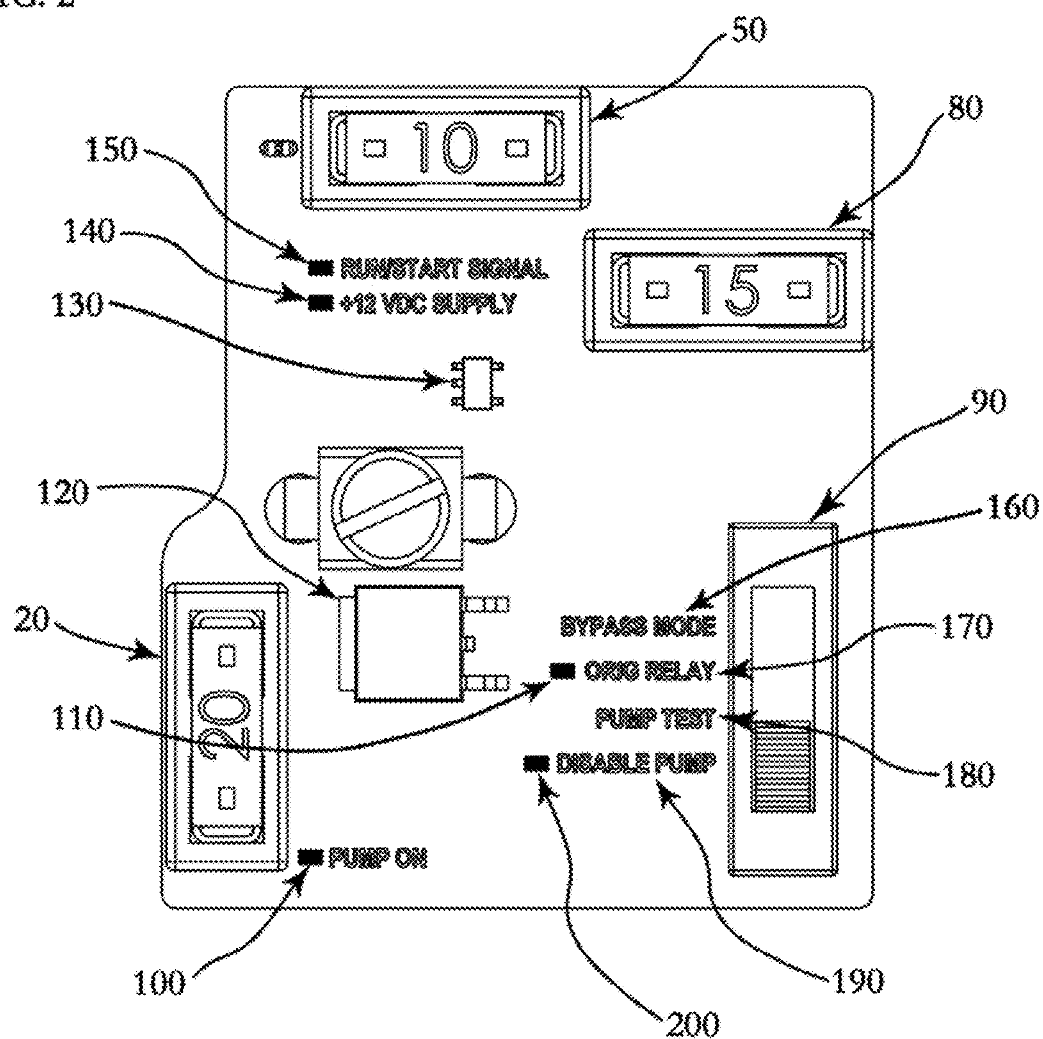
FIG. 2 is a top view of an exemplary fuel pump power bypass/test system according to at least one aspect of the disclosure.

Referring now to FIG. 2, FIG. 2 is a top view of the fuel pump power bypass/test system 280 according to at least one aspect of the disclosure. As shown in FIG. 2, and with reference to FIGS. 3 and 9, the four modes of operation controlled by the four positions of switch 90 include:

1) Bypass Mode 160: This position of switch 90 uses the signal from the vehicle's run/start signal in fuse connection (e.g., 360 of FIG. 9) in the run/start signal fuse slot (e.g., 290 of FIG. 9) to provide +12 VDC power (i.e., electrical current) to switch 90. The presence of the signal from the run/start signal in fuse connection (e.g., 360 of FIG. 9), which typically begins during the engine cranking process in an attempt to start the vehicle and continues until the vehicle is turned off, indicates the vehicle's need for power to be supplied to the fuel pump via the fuel pump fuse connection (e.g., 350 of FIG. 9) in the fuse box.

The signal (i.e., electrical current) from the run/start signal in fuse connection (e.g., 360 of FIG. 9) first enters the fuel pump power bypass/test system 280 via a first terminal pin (e.g., 250 of FIG. 3) coupled to the fuse holder 50 before passing through fuse holder 50 and into fuse 60. It then reenters fuse holder 50 via a second terminal pin (e.g., 240 of FIG. 3). The second terminal pin (e.g., 240 of FIG. 3) of fuse holder 50 passes the signal from the +12 VDC run/start signal in fuse connection (e.g., 360 of FIG. 9) to switch 90 when switch 90 is in the bypass mode 160 position, which triggers switching device 120 to allow source power to pass through it. Switching device 120 may include one or more MOSFETs, electro-mechanical relays, solid-state relays, or similar electrical switching devices. Switching device 120 then permits a signal from a high current +12 VDC power in source fuse connection (e.g., 380 of FIG. 9) to pass through it. This signal from the high current +12 VDC power in source fuse connection (e.g., 380 of FIG. 9) is provided via a third terminal pin (e.g., 230 of FIG. 3) coupled to fuse holder 80 before being permitted to pass through switching device 120. It then travels to fuse holder 20, through fuel pump fuse 30, and back to fuse holder 20 before reaching a fourth terminal pin (e.g., 270 of FIG. 3) coupled to fuse holder 20. The fourth terminal pin (e.g., 270 of FIG. 3) is plugged into the fuel pump fuse slot (e.g., 330 of FIG. 9), which then powers the fuel pump via the fuel pump fuse connection (e.g., 350 of FIG. 9) in the fuse box.

Fuse 30, fuse 60, and fuse 70 are sized by their current ratings. Current ratings indicate the amount of electrical current that is permitted to pass through each fuse. In the event of an electrical short or high current draw exceeding the fuse current rating, fuses are designed to blow in order to protect circuit wiring within the vehicle and the fuel pump power bypass/test system 280.

Still referring to FIG. 2, in order to permit the signal from the run/start signal in fuse connection (e.g., 360 of FIG. 9) to be provided to other electrical circuits within the vehicle, the second terminal pin (e.g., 240 of FIG. 3) is coupled to the run/start signal out fuse connection (e.g., 370 of FIG. 9) within the run/start signal fuse slot (e.g., 290 of FIG. 9). In order to permit the signal from the +12 VDC power in source fuse connection (e.g., 380 of FIG. 9) to be provided to other electrical circuits within the vehicle, a fifth terminal pin (e.g., 220 of FIG. 3) is coupled to the +12 VDC out source fuse connection (e.g., 390 of FIG. 9) within the +12 VDC fuse slot (e.g., 300 of FIG. 9). This arrangement allows the vehicle to maintain the same fuses, fuse slots, and +12 VDC signal configurations after the fuel pump power bypass/test system 280 is installed. As such, the fuel pump power bypass/test system 280 extends fuses and fuse slots through the use of terminal pins that plug in to existing fuse slots. By extending fuses and fuse slots, the fuel pump power bypass/test system 280 exploits the +12 VDC signals that are passed through them.

With continued reference to FIG. 2, a run/start signal LED 150 (labeled as "RUN/START SIGNAL" in FIG. 2) is powered by and can be illuminated (e.g., green) by the signal from the +12 VDC run/start signal in fuse connection (e.g., 360 of FIG. 9), regardless of the position of switch 90. If switch 90 is not in the bypass mode 160 position, the signal from the run/start signal in fuse connection (e.g., 360 of FIG. 9) will not be present at switching device 120 and power will not pass to the fuel pump via the fuel pump fuse connection (e.g., 350 of FIG. 9) in the fuse box as a result. If the +12 VDC source power delivered by switching device 120 reaches the fourth terminal pin (e.g., 270 of FIG. 3), a pump on LED 100 (labeled as "PUMP ON" in FIG. 2) can be illuminated (e.g., green) to indicate that the fuel pump fuse connection (e.g., 350 of FIG. 9) is receiving power while in bypass mode 160. However, the pump on LED 100 can be illuminated while in other modes of switching device 120 as long as a +12 VDC signal is detected at the fourth terminal pin (e.g., 270 of FIG. 3). As will be appreciated, the LEDs can be replaced by other illumination devices, such as incandescent bulbs, lamps, and other light emitting devices powered by the flow of electricity. The bypass mode 160 provides power to the fuel pump fuse connection (e.g., 350 of FIG. 9) when the vehicle's existing faulty fuel pump relay is present.

2) Original Relay Mode 170: This position of switch 90 uses the signal from the vehicle's original fuel pump relay +12 VDC fuse connection (e.g., 340 of FIG. 9) sent to a sixth terminal pin (e.g., 260 of FIG. 3) to provide +12 VDC power to switch 90. The presence of the signal from the fuel pump relay +12 VDC fuse connection (e.g., 340 of FIG. 9), and whether or not it is able to illuminate an original relay LED 110 (labeled as "ORIG RELAY" in FIG. 2), indicates how well the vehicle's original fuel pump relay is working. For instance, during the engine cranking process, in an attempt to start the vehicle, the signal from the fuel pump relay +12 VDC fuse connection (e.g., 340 of FIG. 9) should be present and constant. If the signal from the fuel pump relay +12 VDC fuse connection (e.g., 340 of FIG. 9), and thereby the illumination of the original relay LED 110, is intermittent or non-existent, it may indicate that the vehicle's original fuel pump relay is faulty, at least to some degree. This diagnostic capability included within the fuel pump power bypass/test system 280 is useful in determining if a vehicle's no-start or battery drained condition is the result of a faulty fuel pump relay.

The fuel pump power bypass/test system 280 utilizes the signal from the fuel pump relay +12 VDC fuse connection (e.g., 340 of FIG. 9) in two ways. First, by illuminating the original relay LED 110, the fuel pump power bypass/test system 280 provides visual feedback as to whether or not the fuel pump relay is working properly. Second, the fuel pump power bypass/test system 280 can permit the vehicle's fuel pump fuse connection (e.g., 350 of FIG. 9) to be powered in a manner that mimics the signal from the vehicle's original fuel pump relay +12 VDC fuse connection (e.g., 340 of FIG. 9). If the vehicle's original fuel pump relay +12 VDC signal is intermittent or non-existent, the fuel pump power bypass/test system's 280 +12 VDC power output to the fuel pump fuse connection (e.g., 350 of FIG. 9) will be identical. In this way, the original relay mode 170 is useful for diagnostic purposes, although it can also be useful if the user desires to operate the vehicle using the output from the vehicle's original fuel pump relay.

The sixth terminal pin (e.g., 260 of FIG. 3) passes the signal from the fuel pump relay +12 VDC fuse connection (e.g., 340 of FIG. 9) to switch 90 when switch 90 is in the original relay mode 170 position, which triggers switching device 120 to allow source power to pass through it. Switching device 120 then permits a signal from the high current +12 VDC power in source fuse connection (e.g., 380 of FIG. 9) to pass through it. This signal from the high current +12 VDC power in source fuse connection (e.g., 380 of FIG. 9) is provided via the third terminal pin (e.g., 230 of FIG. 3) before being permitted to pass through switching device 120. It then travels to fuse holder 20, through fuse 30, and back to fuse holder 20 before reaching the fourth terminal pin (e.g., 270 of FIG. 3). The fourth terminal pin (e.g., 270 of FIG. 3) is plugged in to the fuel pump fuse slot (e.g., 330 of FIG. 9), which then powers the fuel pump fuse connection (e.g., 350 of FIG. 9) and the pump on LED 100.

Still referring to FIG. 2, the original relay LED 110 is illuminated when the signal from the fuel pump relay +12 VDC fuse connection (e.g., 340 of FIG. 9) is present and the switch 90 is in the original relay mode 170 position. If the +12 VDC source power delivered by switching device 120 reaches the fourth terminal pin (e.g., 270 of FIG. 3), the pump on LED 100 can be illuminated to indicate that the fuel pump fuse connection (e.g., 350 of FIG. 9) is receiving power while in the original relay mode 170.

3) Fuel Pump Test Mode 180: This position of switch 90 permits the user to test the proper electrical operation of the fuel pump fuse connection (e.g., 350 of FIG. 9) when the vehicle is on or off. This mode can also be utilized to drain the vehicle's fuel tank by pumping fuel out of the fuel tank when the vehicle is off. When placed in this mode, +12 VDC power from the third terminal pin (e.g., 230 of FIG. 3) is provided to power the fuel pump via the fuel pump fuse connection (e.g., 350 of FIG. 9). If the +12 VDC source power delivered by switching device 120 reaches the fourth terminal pin (e.g., 270 of FIG. 3), the pump on LED 100 can illuminate to indicate that the fuel pump fuse connection (e.g., 350 of FIG. 9) is receiving power while in fuel pump test mode 180.

When switch 90 is in fuel pump test mode 180, it allows a +12 VDC signal to pass to switching device 120. Switching device 120 then permits a signal from the high current +12 VDC power in source fuse connection (e.g., 380 of FIG. 9) to pass through it. This signal from the high current +12 VDC power in source fuse connection (e.g., 380 of FIG. 9) is provided via the third terminal pin (e.g., 230 of FIG. 3) before being permitted to pass through switching device 120. It then travels to fuse holder 20, through fuse 30, and back to fuse holder 20 before reaching the fourth terminal pin (e.g., 270 of FIG. 3). The fourth terminal pin (e.g., 270 of FIG. 3) is plugged in to the fuel pump fuse slot (e.g., 330 of FIG. 9), which then powers the fuel pump fuse connection (e.g., 350 of FIG. 9).

4) Disable Fuel Pump Mode 190: This position of switch 90 provides no output +12 VDC power from switch 90 to switching device 120 and, in turn, no power to the fuel pump fuse connection (e.g., 350 of FIG. 9). The vehicle cannot be started in this mode, which allows this mode to serve as an anti-theft device.

Still referring to FIG. 2, a disable pump LED 200 (labeled as "DISABLE PUMP" in FIG. 2) can be illuminated (e.g., red) when switch 90 is in the disable fuel pump mode 190 position to indicate that the fuel pump fuse connection (e.g., 350 of FIG. 9) is disabled. The disable pump LED 200 is powered by the signal from the +12 VDC power in source fuse connection (e.g., 380 of FIG. 9) across the third terminal pin (e.g., 230 of FIG. 3) via switch 90.

In an aspect, the disable fuel pump mode 190 and bypass mode 160 positions may be on the extreme ends of switch 90. Thus, if the vehicle is in a collision, the force of the impact has the potential to overcome the friction that typically holds the switch 90 in place and to cause the switch 90 to move to either of these extreme positions. Both of these modes will result in a disabled fuel pump, which is a beneficial safety feature in a collision.

Continuing to refer to FIG. 2, a comparator circuit 130 determines whether a +12 VDC supply LED 140 (labeled as "+12 VDC SUPPLY" in FIG. 2) should be illuminated. If the signal from the +12 VDC power in source fuse connection (e.g., 380 of FIG. 9) is greater than +12.0 VDC, regardless of the position of switch 90, the +12 VDC supply LED 140 can illuminate to indicate that the vehicle likely has sufficient battery power to start the vehicle. The +12 VDC supply LED 140 is also included within the fuel pump power bypass/test system 280 for troubleshooting purposes.

As will be appreciated, the labels of the various LEDs (e.g., the run/start signal LED 150, the +12 VDC supply LED 140, the pump on LED 100, the disable pump LED 200, and the original relay LED 110) are merely exemplary, and any labels may be used that convey similar information. Alternatively, the LEDs may not be labeled.

Figure 3:
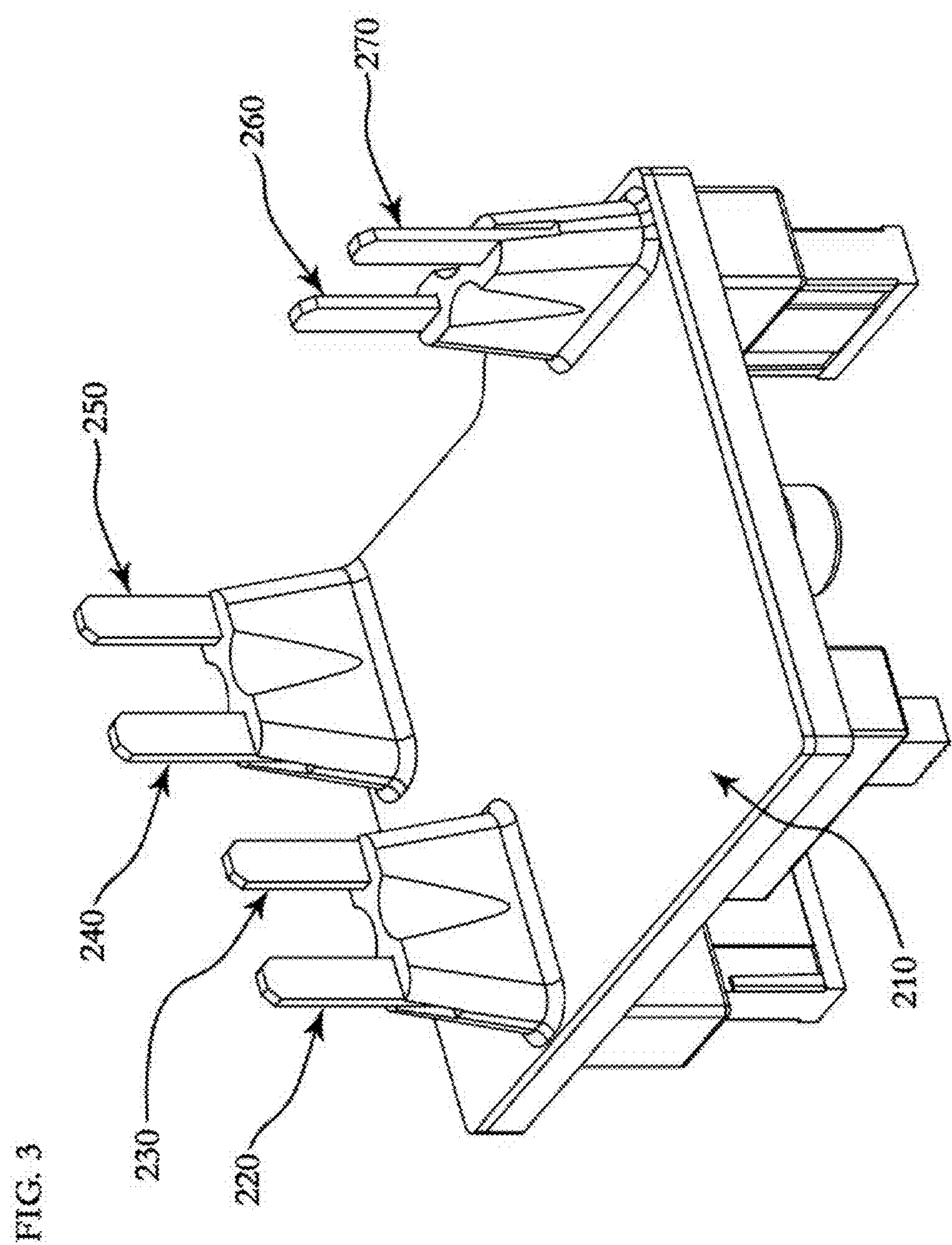
FIG. 3 is a perspective isometric view of an exemplary fuel pump power bypass/test system according to at least one aspect of the disclosure.
Figure 6:
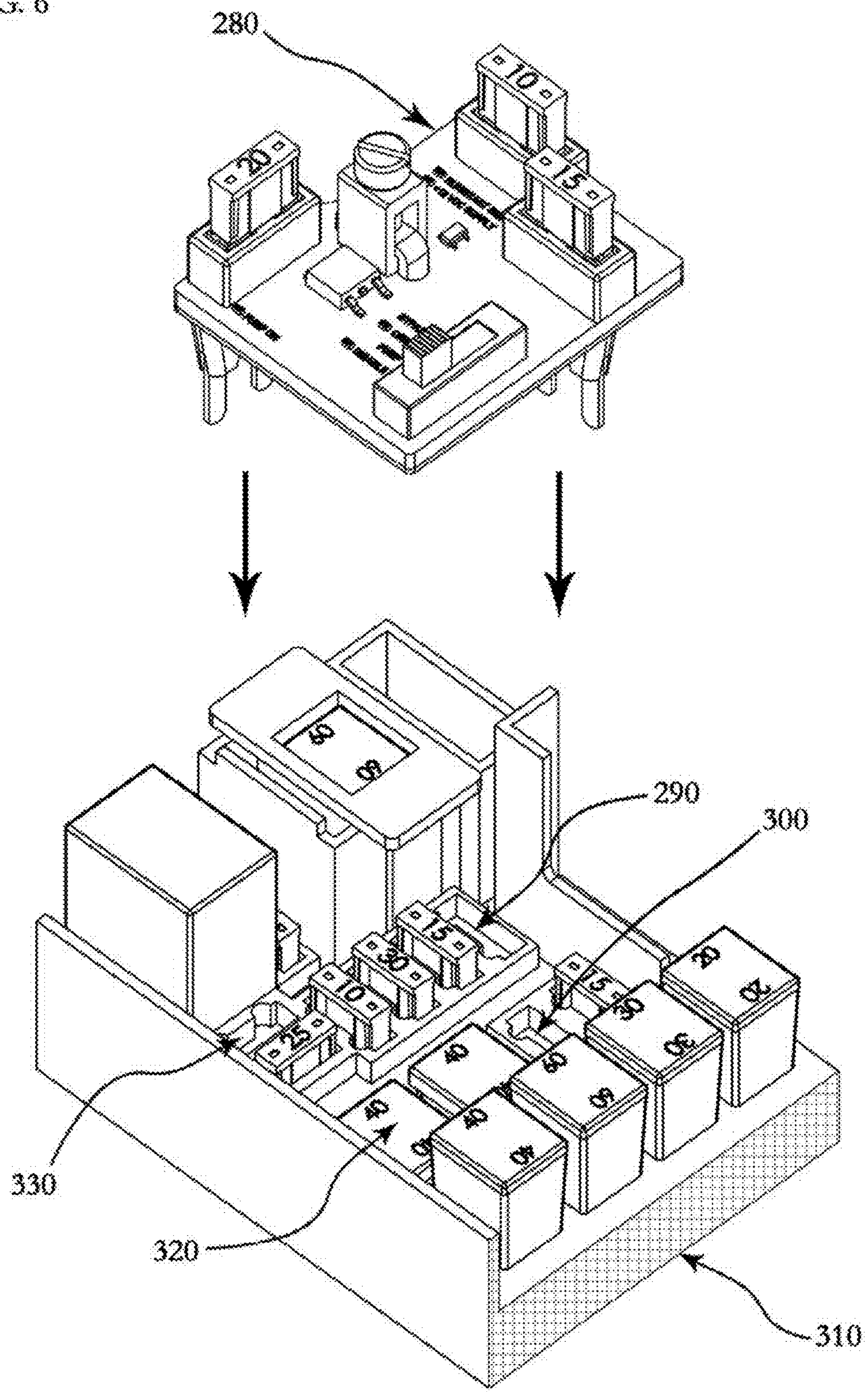
FIG. 6 is a perspective isometric view of an installation of an exemplary fuel pump power bypass/test system according to at least one aspect of the disclosure.

Turning now to FIG. 3, FIG. 3 illustrates the terminal pins attached to the bottom of an exemplary circuit board 10 that plugs into the vehicle's existing fuse box assembly (e.g., 310 of FIG. 6) according to at least one aspect of the disclosure. With reference to FIGS. 6 and 9, terminal pin 230 (coupled to fuse holder 80) is the entry point for +12 VDC source power into the fuel pump power bypass/test system 280 via the +12 VDC power in source fuse connection (e.g., 380 of FIG. 9) located within the +12 VDC fuse slot (e.g., 300 of FIG. 6). Terminal pin 220 (coupled to fuse holder 80) then passes the signal from the +12 VDC out source fuse connection (e.g., 390 of FIG. 9) out of the fuel pump power bypass/test system 280 into the +12 VDC fuse slot (e.g., 300 of FIG. 6) for use by the vehicle within other electrical circuits. Terminal pin 270 (coupled to fuse holder 20) provides power output from the fuel pump power bypass/test system 280 to the fuel pump fuse connection (e.g., 350 of FIG. 9) via the fuel pump fuse slot (e.g., 330 of FIG. 6). Terminal pin 260 connects to the fuel pump relay +12 VDC fuse connection (e.g., 340 of FIG. 9) via the fuel pump fuse slot (e.g., 330 of FIG. 6) and passes the signal from the fuel pump relay +12 VDC fuse connection (e.g., 340 of FIG. 9) to the switch 90. Terminal pin 250 (coupled to the fuse holder 50) plugs into the run/start signal fuse slot (e.g., 290 of FIG. 6) in order to receive the signal from the run/start signal in fuse connection (e.g., 360 of FIG. 9), which is a +12 VDC feed indicating that the vehicle is attempting to start or is currently running. Terminal pin 240 (coupled to fuse holder 50) is the return path for the signal from the run/start signal out fuse connection (e.g., 370 of FIG. 9) in the run/start signal fuse slot (e.g., 290 of FIG. 6).

With continued reference to FIG. 3, in an aspect, bottom cover 210 is a non-conductive (e.g., plastic) protective device that slides over terminal pins 220 to 270. It serves to protect the bottom surface of circuit board 10 from electrical shorts between the fuel pump power bypass/test system 280 and fuses installed in the vehicle's existing fuse box assembly (e.g., 310 of FIG. 6). Additionally, bottom cover 210 provides stability and alignment for terminal pins 220 to 270 by supporting them at specific horizontal and vertical locations that coincide with the run/start signal fuse slot (e.g., 290 of FIG. 6), the +12 VDC fuse slot (e.g., 300 of FIG. 6), and the fuel pump fuse slot (e.g., 330 of FIG. 6). Bottom cover 210 contains raised areas surrounding terminal pins 220 to 270 that mimic the shape of fuses that are normally located in the run/start signal fuse slot (e.g., 290 of FIG. 6), the +12 VDC fuse slot (e.g., 300 of FIG. 6), and the fuel pump fuse slot (e.g., 330 of FIG. 6). A high temperature adhesive may be used to join circuit board 10 and bottom cover 210. Bottom cover 210 may contain voids in the top surface where it joins circuit board 10 in order to accommodate protruding pins of switch 90 and ground 40.

Figure 4:
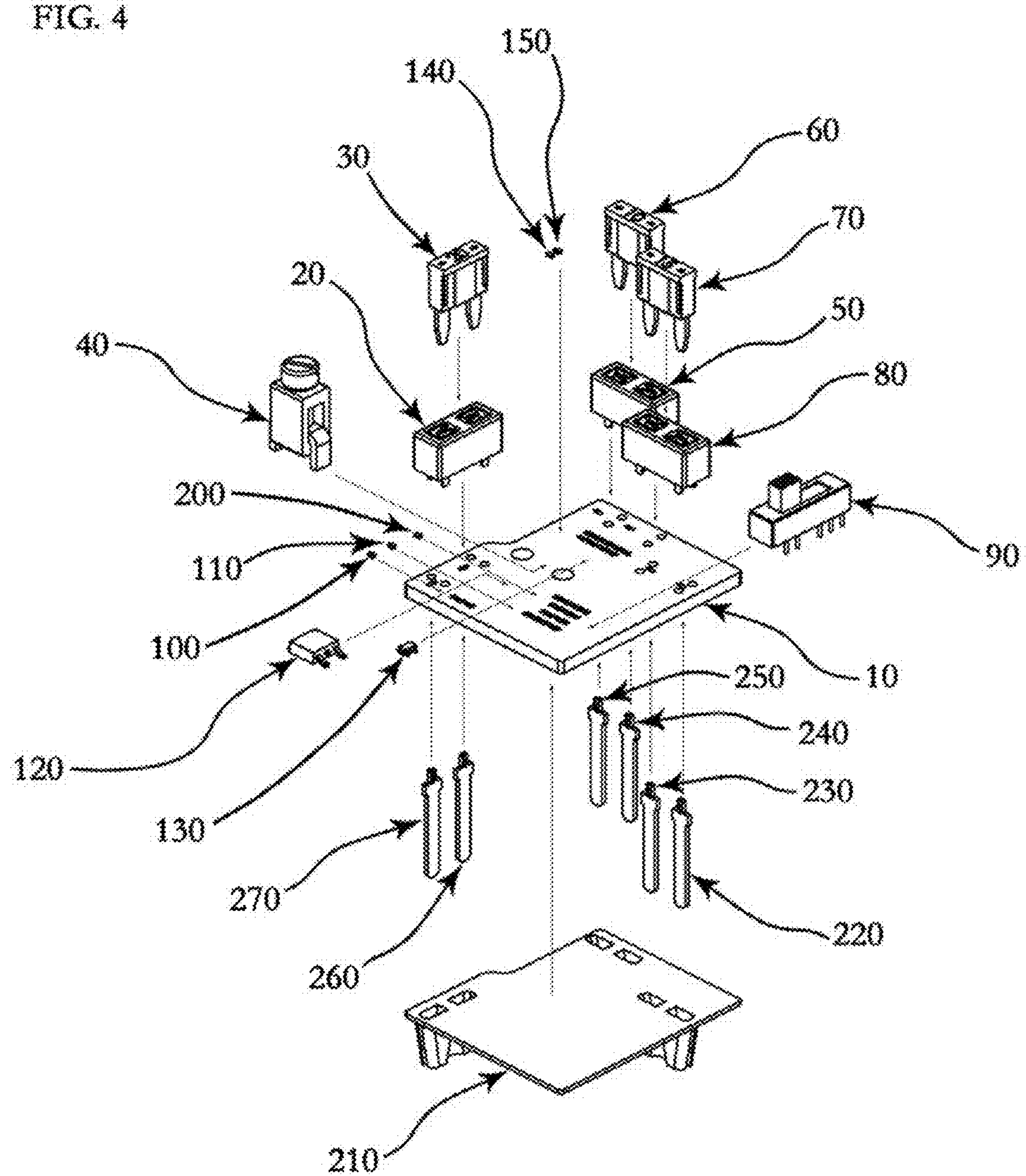
FIG. 4 is an exploded view of an exemplary fuel pump power bypass/test system according to at least one aspect of the disclosure.

Referring to FIG. 4, FIG. 4 is an exploded view of an exemplary fuel pump power bypass/test system 280 showing various components prior to assembly, according to at least one aspect of the disclosure. In an aspect, the illustrated components, with the exception of fuse 30, fuse 60, fuse 70, and bottom cover 210 may be soldered to circuit board 10.

Figure 5:
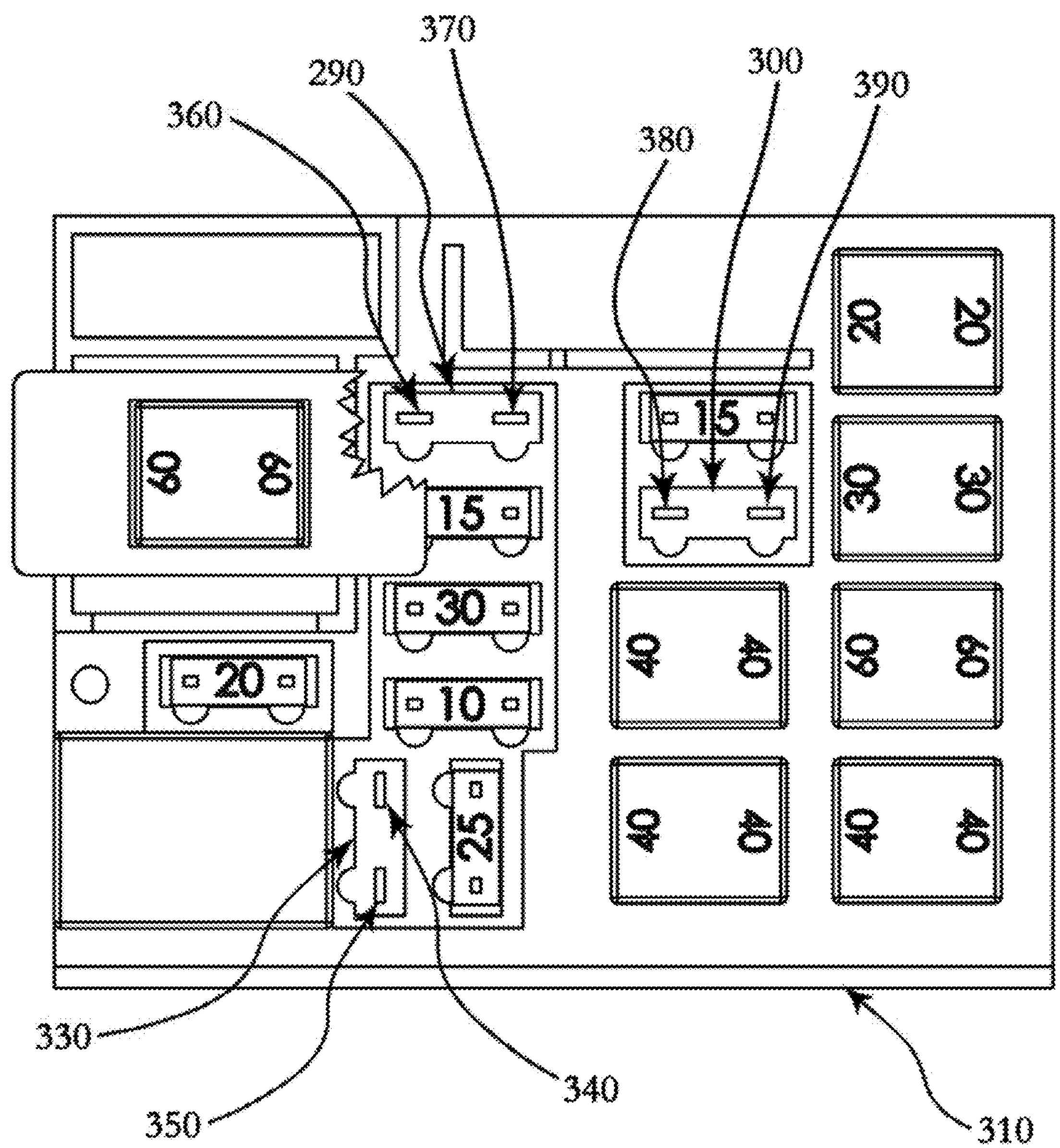
FIG. 5 is a top view of an exemplary fuse box assembly according to at least one aspect of the disclosure.

FIG. 5 is a top view of an exemplary fuse box assembly showing the vehicle's existing fuse slots and corresponding fuse receptacles utilized by the fuel pump power bypass/test system 280 in order to bypass and test the existing fuel pump relay, according to at least one aspect of the disclosure. The existing fuse slots and fuse connections include:

1) The fuel pump relay +12 VDC fuse connection 340 in fuse slot 330: This is the +12 VDC connection from the vehicle's existing fuel pump relay to the fuel pump fuse connection 350. The fuel pump power bypass/test system 280 utilizes and interrupts the transfer of the signal from this fuse connection.

2) The fuel pump fuse connection 350 in fuse slot 330: This is typically the +12 VDC output connection to the fuel pump provided by the vehicle's existing fuel pump relay. The fuel pump power bypass/test system 280 utilizes and controls the transfer of the signal from this fuse connection by providing alternate sources of power.

3) The run/start in fuse connection 360 in fuse slot 290: This connection carries the +12 VDC signal to the run/start out fuse connection 370 to indicate that the vehicle is starting or running. In the event of a crash, this signal ceases. The fuel pump power bypass/test system 280 utilizes the signal from this fuse connection for use in the bypass mode 160 to provide alternate power to the fuel pump fuse connection 350.

4) The run/start out fuse connection 370 in fuse slot 290: This connection carries the return +12 VDC signal provided to various fuse box assembly 310 components after passing through the fuel pump power bypass/test system 280 to indicate that the vehicle is starting or running.

5) The +12 VDC power in source fuse connection 380 in fuse slot 300: The fuel pump power bypass/test system 280 utilizes this connection to provide the high current +12 VDC source for use in providing power to the fuel pump fuse connection 350.

6) The +12 VDC out source fuse connection 390 in fuse slot 300: This connection provides the return feed for the signal from the +12 VDC power in source fuse connection 380 after passing through fuse 70.

Referring now to FIG. 6, FIG. 6 illustrates an exemplary fuel pump power bypass/test system 280 as it is being inserted into a vehicle's existing fuse box assembly 310, according to at least one aspect of the disclosure. In the example of FIG. 6, fuse 60, fuse 70, and fuse 30 have been removed from the run/start signal fuse slot 290, the +12 VDC fuse slot 300, and the fuel pump fuse slot 330, respectively. Also in the example of FIG. 6, fuse 320 has been replaced with a lower profile version to provide room for the fuel pump power bypass/test system 280 to be plugged in to fuse box assembly 310.

The fuel pump power bypass/test system 280 may be designed to be manually plugged in to the run/start signal fuse slot 290, the +12 VDC fuse slot 300, and the fuel pump fuse slot 330 in the same or similar manner that any ordinary fuse would be inserted into a fuse box using vertical downward force. The bottom cover 210 may be designed to impact the bottom of the run/start signal fuse slot 290, the +12 VDC fuse slot 300, and the fuel pump fuse slot 330 to determine the maximum downward position of the fuel pump power bypass/test system 280. Removal of the fuel pump power bypass/test system 280 may be accomplished by reversing the manual insertion process. No tools are required for insertion or removal of the exemplary fuel pump power bypass/test system 280 in the fuse box assembly 310.

Figure 7:
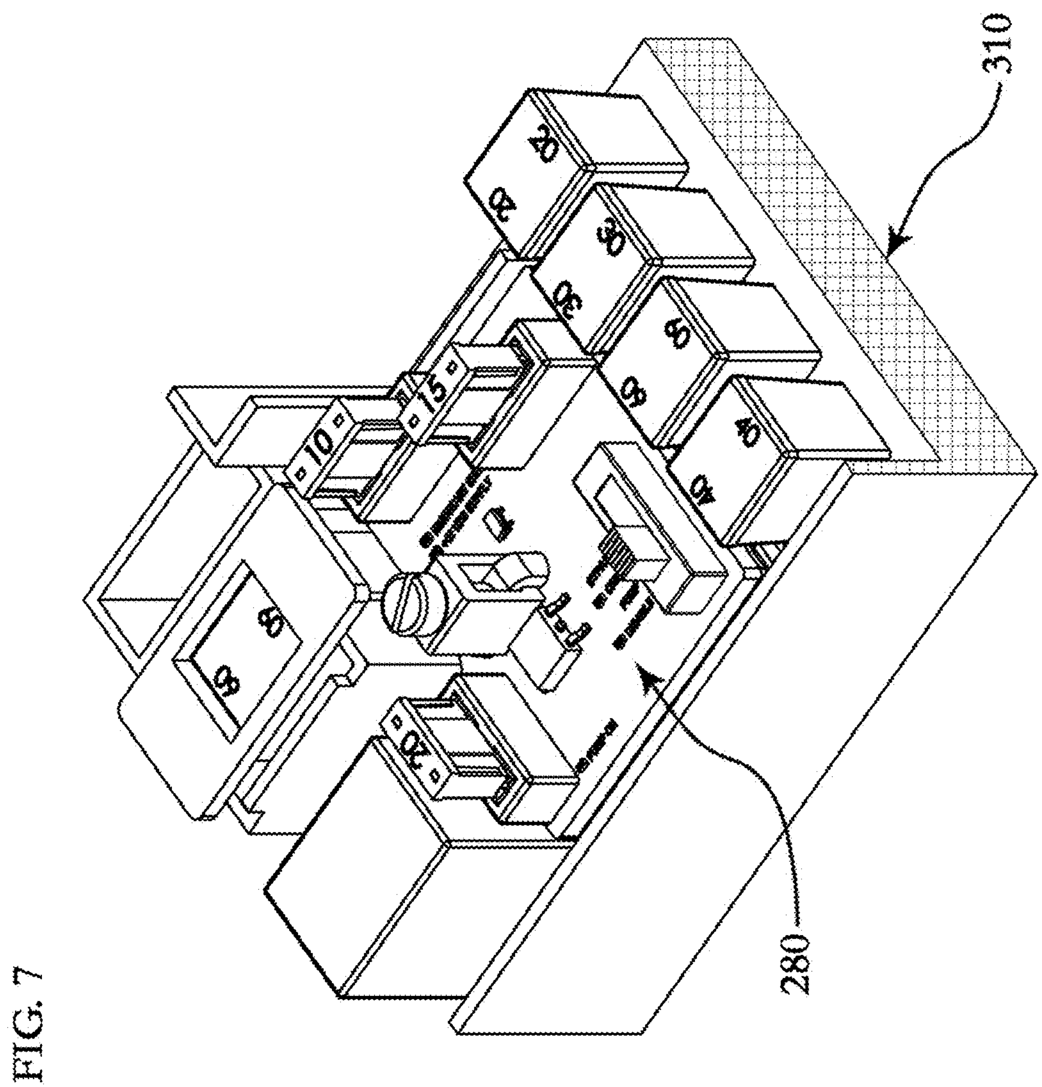
FIG. 7 is a perspective isometric view of an exemplary fuel pump power bypass/test system installed in an exemplary fuse box according to at least one aspect of the disclosure.

FIG. 7 illustrates an exemplary fuel pump power bypass/test system 280 after it has been inserted into a vehicle's existing fuse box assembly 310, according to at least one aspect of the disclosure. The height of the fuel pump power bypass/test system 280 permits a lid of fuse box assembly 310 to be closed without any contact with the fuel pump power bypass/test system 280. The fuel pump power bypass/test system 280 may be positioned directly above existing fuses that are installed in the fuse box assembly 310. The six terminal pins 220 to 270 of the fuel pump power bypass/test system 280 may be inserted into fuse slots 290, 300, and 330 to the same depth as that of conventional fuses. Terminal pins 220 to 270 may also emulate the size and shape of existing fuse pins in order to maintain the integrity and function of the fuse slots if the fuel pump power bypass/test system 280 is later removed from the fuse box assembly 310.

FIG. 8 is a top view of an exemplary fuel pump power bypass/test system 280 after it is installed in a vehicle's existing fuse box assembly 310, according to at least one aspect of the disclosure. In an aspect, a single stranded or solid ground wire 410 (e.g., a 20 American wire gauge (AWG) wire) connection from ground lug 40 to the vehicle chassis 400 can be installed in order to complete the electrical circuit and permit proper functionality of the fuel pump power bypass/test system 280. The ground wire 410 can be situated under the lid of the fuse box assembly 310 as it is connected to the vehicle chassis 400. As shown in FIG. 8, the ground wire 410 can also be routed through a hole 420 in the fuse box assembly 310 prior to connection with the vehicle chassis 400. Once ground wire 410 is connected to vehicle chassis ground 400 and a battery voltage of at least +12.0 VDC is detected, the +12 VDC supply LED 140 can illuminate.

FIG. 9 is a block diagram showing exemplary electrical connections between components of the fuel pump power bypass/test system 280 and fuse slots of the existing fuse box assembly (e.g., 310 of FIG. 6) and the paths that are taken by various power sources, according to at least one aspect of the disclosure. The connections and signal paths between the various components illustrated in FIG. 9 are shown by arrows and have been described above. In addition to circuit board 10 of the fuel pump power bypass/test system 280, FIG. 9 also illustrates fuse slots 290, 300, and 330, which are the three fuse slots that the fuel pump power bypass/test system 280 plugs into to permit the transfer of power and signals in order to facilitate the proper functionality of the four modes of operation described above. The ground wire 410 connection from ground lug 40 to the vehicle chassis 400 completes an electrical circuit allowing the fuel pump power bypass/test system 280 to utilize the vehicle's battery and/or alternator power to provide bypass and test functionality.

Figure 10:
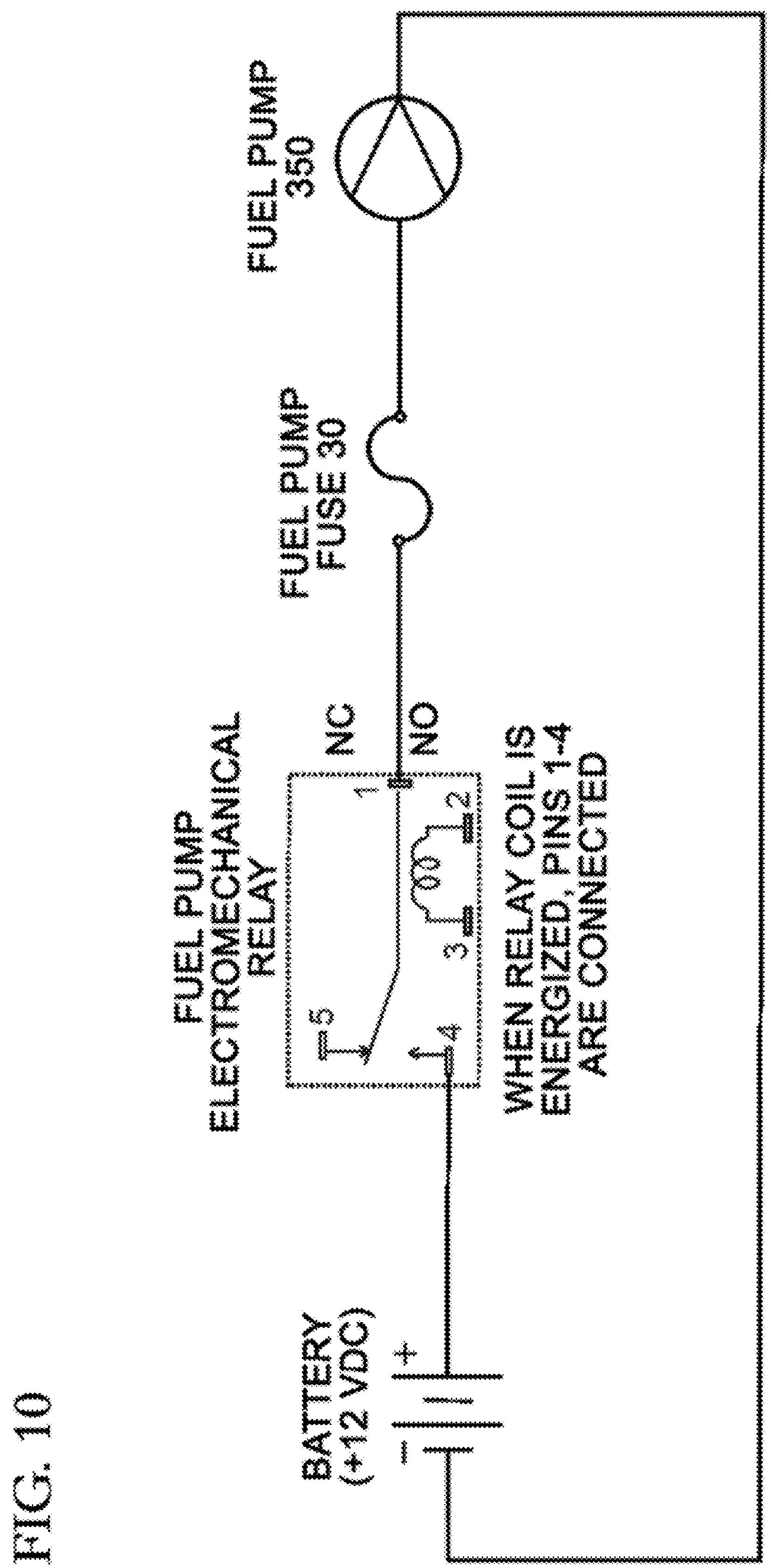
FIG. 10 is a wiring diagram showing the relationship between an exemplary vehicle's fuel pump fuse and fuel pump according to at least one aspect of the disclosure.

FIG. 10 illustrates the relationship between the fuel pump fuse 30 and the fuel pump fuse connection 350 utilized by the fuel pump power bypass/test system 280. As illustrated in FIG. 10, there are five pins in the fuel pump electromechanical relay. When pins one and five are connected, there is no flow of electricity to the fuel pump fuse connection 350. However, when the relay coil in the fuel pump electromechanical relay is energized, pins one to four are connected. The fuel pump power bypass/test system 280 uses this arrangement to inject alternate source power into the fuel pump fuse 30 and to detect the voltage output of the fuel pump relay. Many modern vehicles contain this configuration.

Figure 11:
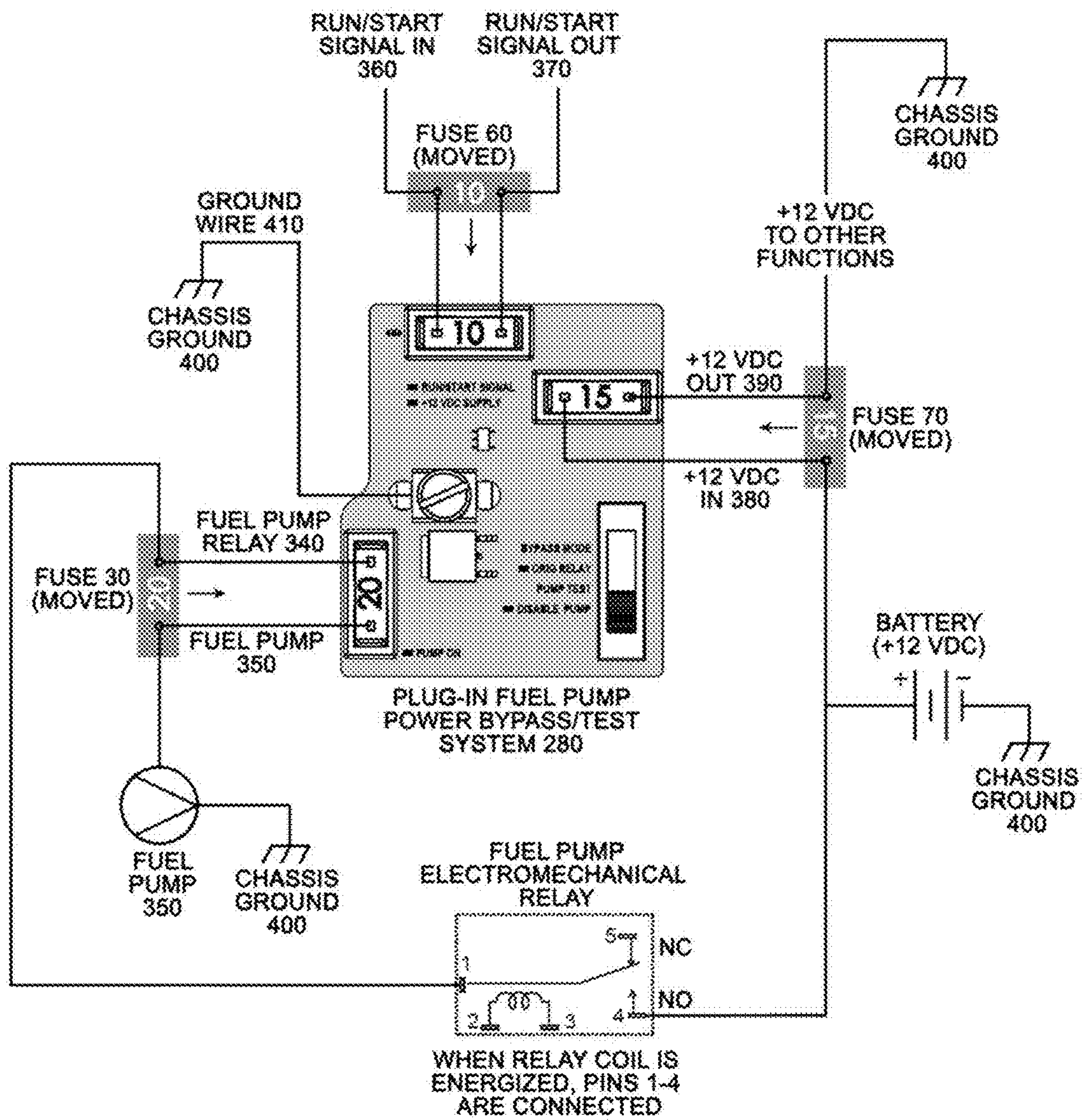
FIG. 11 is a wiring diagram showing how an exemplary fuel pump power bypass/test system integrates with other components of the vehicle according to at least one aspect of the disclosure.

FIG. 11 is a wiring diagram showing how an exemplary fuel pump power bypass/test system 280 integrates with other components of a vehicle according to at least one aspect of the disclosure. For example, the wiring diagram in FIG. 11 shows the fuel pump power bypass/test system's 280 connections to the vehicle's fuse slots, fuel pump fuse connection 350, battery, and the +12 VDC signals. Fuse 30, fuse 60, and fuse 70 (shown in gray outlines) indicate the original fuse locations prior to installation of the fuel pump power bypass/test system 280. These three fuses can be removed from the vehicle's fuse slots and installed in the fuel pump power bypass/test system 280. After connecting the ground wire 410 from ground lug 40 to chassis ground 400, the fuel pump power bypass/test system 280 is ready for use.

While the foregoing disclosure shows various illustrative aspects, it should be noted that various changes and modifications may be made to the illustrated examples without departing from the scope defined by the appended claims. The present disclosure is not intended to be limited to the specifically illustrated examples alone. For example, although the fuel pump power bypass/test system 280 has been described as having various modes of operation corresponding to the position of switch 90 (e.g., bypass mode 160, original relay mode 170, fuel pump test mode 180, and disable fuel pump mode 190), as will be appreciated, the fuel pump power bypass/test system 280 may have fewer than four modes. For example, the fuel pump power bypass/test system 280 could have only one mode of operation, such as a single mode where the fuel pump relay is bypassed. Additionally, although the fuel pump power bypass/test system 280 has been described as plugging into a +12 VDC fuse slot, there may instead be a wire connecting the fuel pump power bypass/test system 280 to (e.g., spliced into) a +12 VDC wire in the vehicle's wire harness. Furthermore, although certain aspects may be described or claimed in the singular, the plural is contemplated unless limitation to the singular is explicitly stated.

What is claimed is:

1. An apparatus configured to bypass and test a fuel pump relay for a fuel pump of a vehicle, comprising:

a first pair of terminal pins configured to be inserted into a run/start signal fuse slot in a fuse box of the vehicle;

a second pair of terminal pins configured to be inserted into a fuel pump fuse slot in the fuse box of the vehicle, the second pair of terminal pins comprising a fuel pump relay terminal pin and a fuel pump terminal pin;

a power input device configured to be conductively coupled to a power source of the vehicle; and a circuit configured to enable a fuel pump relay bypass mode of the apparatus, wherein the circuit being configured to enable the fuel pump relay bypass mode comprises the circuit being configured to conductively couple, based on reception of electrical current from a run/start signal out terminal pin of the first pair of terminal pins, the power input device to the fuel pump terminal pin to provide electrical current from the power input device to the fuel pump of the vehicle.

2. The apparatus of claim 1, wherein the power input device comprises:

a third pair of terminal pins configured to be inserted into a voltage direct current (VDC) fuse slot in the fuse box of the vehicle, wherein the circuit is configured to conductively couple a power input terminal pin of the third pair of terminal pins to the fuel pump terminal pin.

3. The apparatus of claim 2, further comprising:

a first fuse holder coupled to the first pair of terminal pins, the first fuse holder configured to receive a first fuse and to conductively couple the first fuse to the first pair of terminal pins;

a second fuse holder coupled to the second pair of terminal pins, the second fuse holder configured to receive a second fuse and to conductively couple the second fuse to at least one of the second pair of terminal pins; and a third fuse holder coupled to the third pair of terminal pins, the third fuse holder configured to receive a third fuse and to conductively couple the third fuse to the third pair of terminal pins.

4. The apparatus of claim 1, wherein the circuit is further configured to enable an original fuel pump relay operation mode, wherein the circuit being configured to enable the original fuel pump relay operation mode comprises the circuit being configured to conductively couple the fuel pump relay terminal pin to the circuit.

5. The apparatus of claim 1, wherein the circuit is further configured to enable a fuel pump test mode, wherein the circuit being configured to enable the fuel pump test mode comprises the circuit being configured to conductively couple the power input device to the fuel pump terminal pin to provide electrical current from the power input device to the fuel pump of the vehicle.

6. The apparatus of claim 1, wherein the circuit is further configured to enable a disable fuel pump mode, wherein the circuit being configured to enable the disable fuel pump mode comprises the circuit being configured to prevent a conductive connection to the fuel pump terminal pin.

7. The apparatus of claim 6, wherein the circuit being configured to enable the disable fuel pump mode further comprises the circuit being configured to conductively couple the power input device to a disable fuel pump light emitting diode (LED), wherein illumination of the LED indicates that the fuel pump of the vehicle is disabled.

8. The apparatus of claim 1, further comprising:

a comparator circuit, wherein the comparator circuit is configured to conductively couple the power input device to a +12 VDC LED based on electrical current from the power input device being greater than +12.0 VDC.

9. The apparatus of claim 1, further comprising:

a fuel pump relay LED conductively coupled to the fuel pump relay terminal pin of the second pair of terminal pins, wherein continuous illumination of the fuel pump relay LED indicates that the fuel pump relay of the vehicle is operational, and wherein intermittent or non-illumination of the fuel pump relay LED indicates that the fuel pump relay of the vehicle is not operational.

10. The apparatus of claim 1, further comprising:

a run/start signal LED conductively coupled to the run/start signal out terminal pin of the first pair of terminal pins, wherein illumination of the run/start signal LED indicates that the run/start signal out terminal pin of the first pair of terminal pins is receiving electrical current from a run/start signal in terminal pin of the first pair of terminal pins.

11. The apparatus of claim 1, wherein the circuit comprises a switching device coupled to a user-operable switch having a plurality of positions corresponding to a plurality of modes of operation of the apparatus.

12. The apparatus of claim 11, wherein a sliding friction of the user-operable switch is configured to permit movement of the user-operable switch to a mode of the apparatus in which the fuel pump of the vehicle is disabled based on the vehicle being involved in a collision.

13. The apparatus of claim 11, further comprising:

a fuel pump on LED, wherein illumination of the fuel pump on LED indicates that the fuel pump of the vehicle is receiving power independent of a mode of operation of the plurality of modes of operation of the apparatus.

14. The apparatus of claim 1, further comprising:

a ground lug; and a ground wire conductively coupled to the ground lug, wherein the ground wire is configured to conductively couple to a chassis ground of the vehicle or an engine fuel pump control of the vehicle.

15. An apparatus configured to bypass and test a fuel pump relay for a fuel pump of a vehicle, comprising:

a first pair of terminal pins configured to be inserted into a run/start signal fuse slot in a fuse box of the vehicle;

a second pair of terminal pins configured to be inserted into a fuel pump fuse slot in the fuse box of the vehicle, the second pair of terminal pins comprising a fuel pump relay terminal pin and a fuel pump terminal pin;

a third pair of terminal pins configured to be inserted into a voltage direct current (VDC) fuse slot in the fuse box of the vehicle;

a ground wire configured to conductively couple to a chassis ground of the vehicle or an engine fuel pump control of the vehicle;

a switch configured to toggle between a plurality of modes of the apparatus, the plurality of modes comprising a fuel pump relay bypass mode, an original fuel pump relay operation mode, a fuel pump test mode, and a disable fuel pump mode; and a switching device coupled to the switch, wherein, based on the switch being toggled to the fuel pump relay bypass mode, the switch is configured to conductively couple a run/start signal out terminal pin of the first pair of terminal pins to the switching device and the switching device is configured to provide electrical current from a power input terminal pin of the third pair of terminal pins to the fuel pump terminal pin to provide electrical current from the power input terminal pin of the third pair of terminal pins to the fuel pump of the vehicle, wherein, based on the switch being toggled to the original fuel pump relay operation mode, the switch is configured to conductively couple the fuel pump relay terminal pin of the second pair of terminal pins to the switching device and the switching device is configured to provide electrical current from the power input terminal pin of the third pair of terminal pins to the fuel pump terminal pin to provide electrical current from the power input terminal pin of the third pair of terminal pins to the fuel pump of the vehicle, wherein, based on the switch being toggled to the fuel pump test mode, the switch is configured to conductively couple the power input terminal pin of the third pair of terminal pins to the switching device and the switching device is configured to provide electrical current from the power input terminal pin of the third pair of terminal pins to the fuel pump terminal pin to provide electrical current from the power input terminal pin of the third pair of terminal pins to the fuel pump of the vehicle, and wherein, based on the switch being toggled to the disable fuel pump mode, the switch is configured to prevent a conductive connection to the fuel pump terminal pin.

16. The apparatus of claim 15, wherein, based on the switch being toggled to the fuel pump test mode, the fuel pump relay bypass mode, or the original fuel pump relay operation mode, the switching device is further configured to conductively couple the power input terminal pin of the third pair of terminal pins to a fuel pump on light emitting diode (LED), wherein illumination of the fuel pump on LED indicates that the fuel pump of the vehicle is receiving power.

17. The apparatus of claim 15, wherein, based on the switch being toggled to the disable fuel pump mode, the switch is further configured to conductively couple the power input terminal pin of the third pair of terminal pins to a disable fuel pump LED, wherein illumination of the LED indicates that the fuel pump of the vehicle is disabled.

18. The apparatus of claim 15, further comprising:

a comparator circuit, wherein the comparator circuit is configured to conductively couple the power input terminal pin of the third pair of terminal pins to a +12 VDC LED based on an electrical current from the power input terminal pin of the third pair of terminal pins being greater than +12.0 VDC.

19. The apparatus of claim 15, further comprising:

a fuel pump relay LED conductively coupled to the fuel pump relay terminal pin, wherein continuous illumination of the fuel pump relay LED indicates that the fuel pump relay of the vehicle is operational, and wherein intermittent or non-illumination of the fuel pump relay LED indicates that the fuel pump relay of the vehicle is not operational; or a run/start signal LED conductively coupled to the run/start signal out terminal pin of the first pair of terminal pins and a power output terminal pin of the first pair of terminal pins, wherein illumination of the run/start signal LED indicates that the run/start signal out terminal pin of the first pair of terminal pins is receiving electrical current from a run/start in terminal pin of the first pair of terminal pins.

20. An apparatus configured to bypass and test a fuel pump relay for a fuel pump of a vehicle, comprising:

a first pair of terminal pins configured to be inserted into a run/start signal fuse slot in a fuse box of the vehicle;

a second pair of terminal pins configured to be inserted into a fuel pump fuse slot in the fuse box of the vehicle, the second pair of terminal pins comprising at least a fuel pump terminal pin;

a power input device configured to be conductively coupled to a power source of the vehicle; and a circuit configured to conductively couple, based on reception of electrical current from a run/start signal out terminal pin of the first pair of terminal pins, the power input device to the fuel pump terminal pin to provide electrical current from the power input device to the fuel pump of the vehicle.

* * * * *